(12) United States Patent
Onishi et al.

(10) Patent No.: US 8,350,660 B2
(45) Date of Patent: Jan. 8, 2013

(54) RESIN COMPOSITION FOR FILLING DISCHARGE GAP AND ELECTROSTATIC DISCHARGE PROTECTOR

(75) Inventors: Mina Onishi, Tokyo (JP); Yoshimitsu Ishihara, Tokyo (JP)

(73) Assignee: Showa Denko K.K., Tokyo (JP)

( * ) Notice: Subject to any disclaimer, the term of this patent is extended or adjusted under 35 U.S.C. 154(b) by 54 days.

(21) Appl. No.: 13/130,174

(22) PCT Filed: Nov. 10, 2009

(86) PCT No.: PCT/JP2009/069111
§ 371 (c)(1),
(2), (4) Date: May 19, 2011

(87) PCT Pub. No.: WO2010/058715
PCT Pub. Date: May 27, 2010

(65) Prior Publication Data
US 2011/0228432 A1 Sep. 22, 2011

(30) Foreign Application Priority Data

Nov. 21, 2008 (JP) ................................. 2008-297946

(51) Int. Cl.
*H01C 7/10* (2006.01)
(52) U.S. Cl. ........................................... 338/21; 338/13
(58) Field of Classification Search .................. 338/21
See application file for complete search history.

(56) References Cited

U.S. PATENT DOCUMENTS

| | | | |
|---|---|---|---|
| 5,714,794 A | 2/1998 | Tsuyama et al. | |
| 7,167,352 B2 | 1/2007 | Matsuoka et al. | |
| 2004/0001957 A1* | 1/2004 | Seita et al. | 428/457 |
| 2008/0188625 A1 | 8/2008 | Uchida et al. | |

FOREIGN PATENT DOCUMENTS

| | | |
|---|---|---|
| JP | 3-89588 A | 4/1991 |
| JP | 5-67851 A | 3/1993 |
| JP | 9-007730 A | 1/1997 |
| JP | 9-082453 A | 3/1997 |
| JP | 10-27668 A | 1/1998 |
| JP | 2005-353845 A | 12/2005 |
| JP | 2006-274258 A | 10/2006 |
| JP | 2008-045032 A | 2/2008 |

* cited by examiner

Primary Examiner — Kyung Lee
(74) Attorney, Agent, or Firm — Sughrue Mion, PLLC

(57) ABSTRACT

The present invention provides an electrostatic discharge protector capable of taking measures for electrostatic discharge against electronic wiring boards having various designs freely, simply and easily, having excellent accuracy of regulating an operating voltage and capable of being downsized and decreased on its cost, and also provides a resin composition for a discharge gap capable of preparing the electrostatic discharge protector. The resin composition for filling a discharge gap of an electrostatic discharge protector comprises a resin having a urethane structure represented by the formula (1):

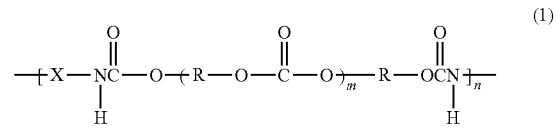

wherein plural R's are each independently an alkylene group of 1 to 18 carbon atoms, X is a bivalent organic group and m and n are each independently an integer of 1 to 20.

The electrostatic discharge protector is obtainable by filling the discharge gap with the resin composition. The discharge gap has a width of 2 to 10 μm.

11 Claims, 1 Drawing Sheet

RESIN COMPOSITION FOR FILLING DISCHARGE GAP AND ELECTROSTATIC DISCHARGE PROTECTOR

CROSS REFERENCE TO RELATED APPLICATIONS

This application is a National Stage of International Application No. PCT/JP2009/069111, filed on Nov. 10, 2009, which claims priority from Japanese Patent Application No. 2008-297946, filed on Nov. 21, 2008, the contents of all of which are incorporated herein by reference in their entirety.

FIELD OF THE INVENTION

The present invention relates to a resin composition for filling a discharge gap and an electrostatic discharge protector, and more particularly, it relates to an electrostatic discharge protector having excellent accuracy for regulating an operating voltage, and capable of being down sized and decreased on its cost, and also relates to a resin composition for filling a discharge gap which composition is used for the electrostatic discharge protector.

TECHNICAL BACKGROUND

Electrostatic discharge (ESD) is one of destructive and unavoidable phenomena that electric systems and integrated circuits are attacked. From the electric view, ESD is a transitional high current phenomenon such that a peak current of several amperes continues for a period of time from 10 n sec to 300 n sec. Therefore, when ESD is generated, an integrated circuit is damaged so that it is hardly repaired, or its volume breaks down or deteriorates so that it does not work normally unless a current of several amperes is conducted outside the integrated circuit within several nano sec. Furthermore, the lightening, thinning and downsizing for electronic parts or electronic apparatuses advance rapidly in recent years. With the rapid progress, the degree of integration in semiconductors and the density of electronic parts mounted on printed wiring boards are increased remarkably with the result that integration is minute, or electronic elements or signal conductors mounted are present very closely each other. Under these circumstances, high frequency radiation noise is easily caused together with the accelerating of the signal-processing rate.

Conventionally, as an element for protecting from static electricity, which protects IC etc. in circuits from ESD, JP-A-2005-353845 discloses an element having a bulk structure, which comprises a sintered matter of a metal oxide etc. This element is a laminated chip varistor made from the sintered matter and is equipped with a laminate and one pair of external electrodes. The varistor has a property such that when the applied voltage reaches a certain value, the current, which has not been flown until now, begins to flow suddenly, and also has excellent blocking force to electrostatic discharge. However, in the production of the laminated chip varistor, which is a sintered matter, a complicated production process including sheet molding, internal electrode printing, sheet lamination, etc. is inevitable and the production also has a problem that delamination and other wrong conditions are easily caused during mounting.

As an electrostatic discharge element for protecting IC and the like in a circuit from ESD, there is a discharge type element. The discharge type element has merits that a leak current is small, the principle thereof is simple and breakdown is hardly caused. Furthermore, in the discharge type element, the discharge voltage can be regulated by the distance of a discharge gap. When the element has a sealing structure, the discharge voltage can be determined by the gas pressure or the gas kind. As a commercially available element, there is an element prepared by forming a cylindrical ceramic surface conductive coating film, providing a discharge gap on the coating film by means of leaser and glass sealing the gap. This glass sealing tube type discharge gap element has excellent properties, but has a limitation on downsizing as a surface-mounting element because of having its complicated form and also has a difficulty in decreasing the cost.

The method of forming a discharge gap on a wiring directly, and regulating the discharge voltage by the distance of the discharge gap is disclosed in the following documents. For example, JP-A-H3 (1991)-89588 discloses that the distance of the discharge gap is 4 mm, and JP-A-H5 (1993)-67851 discloses that the distance of the discharge gap is 0.15 mm. In the smallest gaps according to the conventional techniques, the discharge voltage between the parallel electrodes is about 1 kV or higher. In the protrudent electrodes, the discharge voltage is decreased by about 10 to 20 percents, but this discharge voltage is too high for protecting IC or LSI having a low power supply voltage.

Moreover, when the discharge gap part is not protected, it is presumed that the surface of a conductor is contaminated by humidity or gases in the environment and the discharge voltage is changed. For protecting the discharge gap, it is unpractical to fill the discharge gap with a conventional resist directly because the discharge voltage is vastly increased. When the narrow discharge gap having a distance of about 1 to 2 μm or smaller is filled with a conventional resist, the discharge voltage can be decreased, but the resist filled suffers slight deterioration to cause problems such that the insulating resistance is lowered or continuity occasionally occurs.

The distance of a discharge gap and the optimization of the discharge voltage are disclosed in JP-A-H10 (1998)-27668. It discloses that the discharge gap is preferably 5 to 60 μm for protecting general electronic elements, and the discharge gap is preferably 1 to 30 μm for protecting IC or LSI, which is more sensitive to static electricity and particularly, the discharge gap can be increased to about 150 μm for the use that only a large pulse voltage portion is removed.

With respect to a relationship of the product of the distance of a discharge gap and pressure with discharge voltage, there is a Paschen's law. In the Paschen's law, when the distance of a discharge gap is 7 μmin the air (1 bar, 20° C.), the discharge voltage is determined to 350 V.

As described above, when a discharge gap having a distance of several μm to 50 μm is filled with an insulating resin, the discharge voltage correlating to the distance can be obtained in principle. However, when the application of 8 kV is carried out to human body charged model (HBM) according to IEC61340-3-1 in practical, the insulating resistance is lowered according to the kind of a resin or continuity occurs to cause a problem that it is not endurable to practical use.

Specifically, the resin filled in a discharge gap is preferably a material having high flame resistance and low deterioration by discharging. Examples of such heat resistant resin are fluorine resins such as polytetrafluoroethylene, tetrafluoroethylene/hexafluoropropylene copolymer and tetrafluoroethylene/perfluoroalkoxyethylene copolymer; epoxy compounds such as polyimide resin, alicyclic epoxy resin and novolak type epoxy resin; polyquinoxaline, polyquinoline, polybenzoimidazole, polybenzothiazole, polybenzoxazole, benzimidazobenzo phenanthroline type ladder polymer, poly-4-hydroxy benzoate, silicon resin etc. In a wiring board that a flexible substrate comprises polyimide as a base and the discharge gap between electrodes is 15 μm when to the discharge gap obtainable by filling with a heat resistant resin and curing, a pulse voltage of 8 kV in HBM model is applied, the insulating properties are changed and the electric resistance value is apt to be lowered. Namely, it is turn out that when the insulating resin for protecting a discharge gap merely has heat resistance, the polyimide as a base suffers deterioration to induce short circuit. Furthermore, it is turn out that the resin has limitation on a solvent used for dissolution and has some other problems for practical use thereof.

PRIOR ART

Patent document 1: JP-A-2005-353845
Patent document 2: JP-A-H3 (1991)-89588
Patent document 3: JP-A-H5 (1993)-67851
Patent document 4: JP-A-H10 (1998)-27668

SUMMARY OF THE INVENTION

Subject to be Solved by the Invention

The present invention is intended to solve the above problems and it is an object of the invention to provide an electrostatic discharge protector capable of freely, simply and easily taking measures for ESD against variously designed electronic circuit boards. It is another object of the invention to provide an electrostatic discharge protector having excellent accuracy for regulating an operating voltage and resistance to voltage application repetition and also capable of being downsized and decreased on its cost, and to provide a resin composition for filling a discharge gap which composition is used for producing the electrostatic discharge protector.

Means for Solving the Solvent

The present inventors have been earnestly studied in order to solve the problems associated with the prior arts, and found that a resin having a specific urethane structure is filled in a discharge gap of a pair of electrodes so as to bride the discharge gap and cured so that the distance of the discharge gap is specified and an electrostatic discharge protector having excellent accuracy for regulating an operating voltage and capable of being downsized and decreased on its cost is obtained.

That is to say, the present invention relates to the following items:

The electrostatic discharge protector according to the present invention will be described in detail below.

[1] A resin composition for filling a discharge gap of an electrostatic discharge protector which composition comprises a resin having a urethane structure represented by the following formula (1):

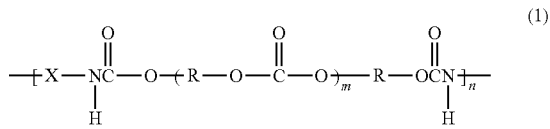

In the formula, plural R's are each independently an alkylene group of 1 to 18 carbon atoms or a cycloalkylene group of 6 to 18 carbon atoms, X is a bivalent organic group and m and n are each independently an integer of 1 to 20.

[2] The resin composition for filling a discharge gap of an electrostatic discharge protector according to [1] wherein the resin having the urethane structure is obtainable by allowing a carbonate diol compound to react with a diisocyanate compound.

[3] The resin composition for filling a discharge gap of an electrostatic discharge protector according to [1] or [2] wherein the resin having the urethane structure has a carboxyl group.

[4] The resin composition for filling a discharge gap of an electrostatic discharge protector according to [3] wherein the resin composition further comprises a curing component having a functional group capable of curing by reacting with the carboxyl group of the resin.

[5] The resin composition for filling a discharge gap of an electrostatic discharge protector according to any one of [1] to [4] which composition further comprises at least one conductive particle selected from the group consisting of nickel, copper, aluminum, silver, gold, zinc, iron, tungsten, metal alloy, carbon black, graphite, black lead, carbon fiber prepared by a gas phase method, polypyrol resin powder and polyaniline powder.

[6] An electrostatic discharge protector obtainable by filling a discharge gap with an insulating member formed from the resin composition for filling a discharge gap as described in any one of [1] to [4] wherein the discharge gap has a width of 2 to 10 μm.

[7] An electrostatic discharge protector obtainable by filling a discharge gap with an insulating member formed from the resin composition for filling a discharge gap as described in [5] wherein the discharge gap has a width of 30 to 150 μm.

[8] An electronic circuit board provided with the electrostatic discharge protector as described in [6] or [7].

[9] An electronic apparatus provided with the electronic circuit board as described in [8].

Effect of the Invention

The electrostatic discharge protector of the present invention can be formed by forming a discharge gap at a necessary spot and in accordance with a necessary operating voltage, filling the resin composition for filling a discharge gap according to the present invention into the discharge gap and curing. Therefore, using the resin composition for filling a discharge gap according to the present invention, a small size electrostatic discharge protector can be produced at low cost and thereby protection from electrostatic discharge can be realized easily. Furthermore, when the resin composition for filling a discharge gap according to the present invention is used, since it is possible to regulate an operating voltage by determining the distance of the discharge gap, the electrostatic discharge protector of the present invention has excellent accuracy for regulating an operating voltage. Moreover, the electrostatic discharge protector according to the present invention is suitably used to digital equipment including cellular phones and the like, mobile equipment that is frequently touched by our hands and other equipment.

EMBODIMENT FOR CARRYING OUT THE INVENTION

Figure 1:
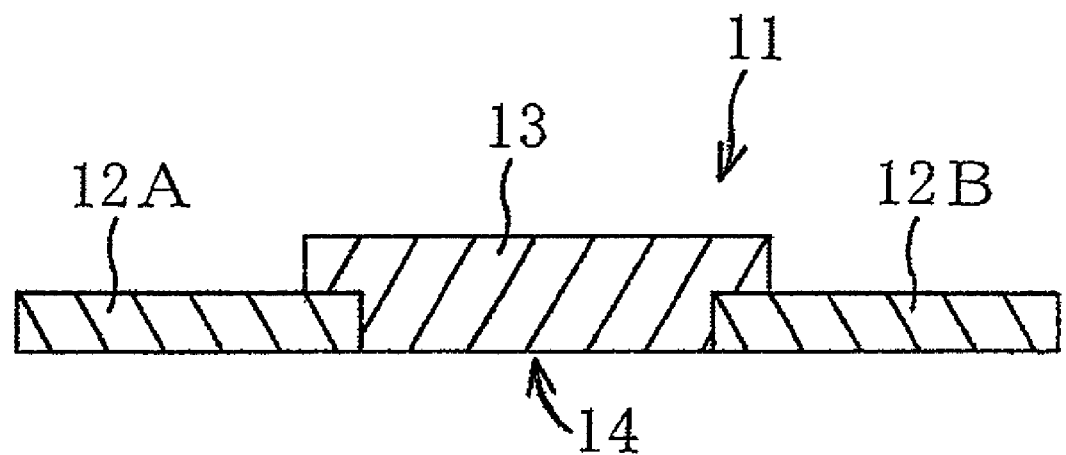
FIG. 1 is a vertical section of an electrostatic discharge protector 11, which is one embodiment of the electrostatic discharge protectors according to the present invention.

The resin composition for filling a discharge gap and the electrostatic discharge protector according to the present invention will be described in detail below.

<Resin Composition for Filling a Discharge Gap>

The resin composition for filling a discharge gap according to the present invention comprises a resin having a urethane structure represented by the following formula (1).

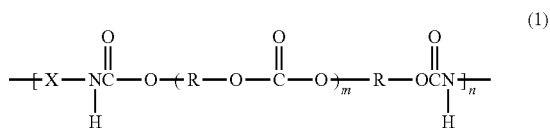

(1)

In the formula (1), plural R's are each independently an alkylene group of 1 to 18 carbon atoms or a cycloalkylene group of 6 to 18 carbon atoms, x is a bivalent organic group, and m and n are each independently an integer of 1 to 20. When R is an alkylene group, R is preferably an alkylene group of 3 to 15 carbon atoms, more preferably an alkylene group of 4 to 10 carbon atoms. When R is a cycloalkylene group, R is preferably a cycloalkylene group of 6 to 15 carbon atoms, more preferably a cycloalkylene group of 6 to 10 carbon atoms. X is preferably an organic group derived from an isocyanate compound having an aromatic ring or an alicyclic ring. m and n are determined in accordance with the desired molecular weight of a resin generated. The above resin may be used singly or two or more may be combined for use.

In the electrostatic discharge protector produced using the resin composition for filling a discharge gap, it is found that when an 8 kV pulse voltage is applied 50 times, the insulating properties at a normal operating time (for example, DC10V) are not changed all. The insulating material is a material capable of conducting dielectric polarization, namely it is present at the position of a dielectric. It is well known that when the voltage applied on a dielectric is slowly increased, the current flown in the dielectric is increased non-linearly, and when the voltage is further increased, the current is increased largely and thereby the dielectric loses electric insulating properties. This dielectric breakdown phenomenon is largely changed by not only the essential properties inherent in the dielectric but also the edge effect of an electrode (structure of the electrode, materials and the like) and the secondary effect (local exothermic, space electric charge and the like). It is presumed the resin having the urethane structure of the present invention has an effect such that the carbonate skeleton having resistance to heat generated by a high voltage operates effectively and thereby in discharging an instant discharging current at a high voltage, the urethane skeleton smoothly flows the current to prevent the resin from deterioration and also prevent the substrate of the electrode from deterioration. The discharge gap distance is studied using the resin. When the distance is less than 2 μm, a stable operating voltage cannot be obtained because it is difficult to control the accuracy of the distance. When the distance is 2 μm to 10 μm, more preferably 2 μm to 7 μm, the operating voltage becomes 300 to 500 V and an electrostatic discharge protector having high resistance to repetition is obtained.

Resin Having a Urethane Structure

The resin having a urethane structure represented by the formula (1) (hereinafter, sometimes referred to "urethane resin") has a urethane bond formable by reacting a carbonate diol compound with an isocyanate compound. Therefore, the urethane resin is obtainable by reacting the carbonate diol compound with the isocyanate compound. In the reaction, a monohydroxyl compound may be added as an end-sealing agent.

Examples of the carbonate diol compound are a carbonate diol compound having a repeating unit derived from one or two or more linear aliphatic diols as a constituting unit, a carbonate diol compound having a constituting unit derived from one or two or more alicyclic diols, and a carbonate diol compound having a repeating unit derived from the both diols as a constituting unit.

Specific examples of the carbonate diol compound are a carbonate diol compound having a repeating unit derived from one or two or more linear aliphatic diols as a constituting unit are preferably polycarbonate diols having a structure such that diol components are connected with a carbonate bond, such as 1,3-propane diol, 1,4-butane diol, 1,5-pentane diol, 1,6-hexane diol, 3-methyl-1,5-pentane diol, 2-methyl-1,8-octane diol, 1,9-nonane diol, 1,4-cyclohexane dimethanol, 1,3-cyclohexane dimethanol, 1,4-cyclohexane diol, 1,3-cyclohexane diol, tricyclohexane dimethanol and pentacyclopentadecane dimethanol. These two or more diol components may be combined for use.

Specific examples of the carbonate diol compound having a constituting unit derived from one or two or more alicyclic diols are preferably polycarbonate diols having a structure such that the diol components are connected with a carbonate bond, such as 1,4-cyclohexane dimethanol, 1,3-cyclohexane dimethanol, 1,4-cyclohexane diol, 1,3-cyclohexane diol, tricyclodecane dimethanol and pentacyclopentadecane dimethanol. These two or more diol components may be combined for use. Commercially available examples of the carbonate diol compound are Trade Names ETERNACOLL UC-100, UM-90 (3/1), UM-90 (1/1) and UM-90 (1/3) manufactured by Ube Industries, Ltd.

Commercially available examples of the carbonate diol compound are Trade Names PLACCEL, CD-205, 205PL, 205HL, 210, 210PL, 210HL, 220, 220PL, 220HL manufactured by Daicel Chemical Co., Ltd., Trade Names UC-CARB100, UM-CARB90 and UH-CARB100 manufactured by Ube Industries, Ltd., and Trade Names C-1065N, C-2015N, C-1015N and C-2065N manufactured by Kuray Co., Ltd.

These carbonate diol compounds may be used singly or two or more may be combined for use. The use of the carbonate diol compound containing a repeating unit derived from linear aliphatic diol as a constituting unit can easily provide an electrostatic discharge protector on a flexible wiring board because the carbonate diol compound has a tendency that resins having excellent low warpage and excellent flexibility are obtained. Furthermore, the use of the carbonate diol compound having a repeating unit derived from alicyclic diol as a constituting unit can provide resins having high crystallinity and excellent heat resistance. As described above, it is preferred to use two or more of these carbonate diol compounds or the carbonate diol compounds having the repeating units derived from both of linear aliphatic diol and alicyclic diol as a constituting unit. In order to exhibit well balance between flexibility and heat resistance, it is preferred to use the carbonate diol compound having a copolymerization ratio by mass of linear aliphatic diol to alicyclic diol of 3:7 to 7:3.

The carbonate diol compound has a number average molecular weight of preferably not more than 5000. When the number average molecular weight is over 5000, the relative amount of urethane bonds is decreased and thereby a charged current caused in application with a high voltage does not flow smoothly, and the resin or the base substrate on which the discharge gap is provided is occasionally short-circuited. As a result, it is difficult to secure the high voltage properties of the electrostatic discharge protector.

Examples of the isocyanate compound are diisocyanates such as 2,4-toluene diisocyanate, 2,6-toluene diisocyanate, isophorone diisocyanate, hexamethylene diisocyanate, diphenylmethylene diisocyanate, (o, m or p)-xylene diisocyanate, (o, m or p)-hydrogenated xylene diisocyanate, methylenebis(cyclohexyl isocyanate), trimethylhexamethylene diisocyanate, cyclohexane-1,3-dimethylene diisocyanate, cyclohexane-1,4-dimethylene diisocyanate, 1,3-trimethylene diisocyanate, 1,4-tetramethylene diisocyanate, 2,2,4-trimethylhexamethylene diisocyanate, 2,4,4-trimethylhexamethylene diisocyanate, 1,9-nonamethylene diisocyanate, 1,10-decamethylenediisocyanate, 1,4-cyclohexane diisocyanate, 2,2'-diethylether diisocyanate, cyclohexane-1,4-dimethylene diisocyanate, 1,5-naphthalene diisocyanate, p-phenylene diisocyanate, 3,3'-methylene ditolylene-4,4'-diisocyanate, 4,4'-diphenylether diisocyanate, tetrachlorophenylene diisocyanate, norbornane diisocyanate, 4,4'-diphenylmethane diisocyanate and 1,5-naphthalene diisocyanate. These isocyanate compounds may be used singly or two or more may be combined for use.

Of these, alicyclic diisocyanates derived from alicyclic diamine such as isophorone diisocyanate or (o, m or p)-hydrogenated xylene diisocyanate are preferred. The use of these diisocyanates can provide cured products having excellent resistance to high voltage.

The urethane resin used in the present invention preferably has a carboxyl group. When the urethane resin has a carboxyl group, crosslinking can be carried out by using, for example, an epoxy compound or carbodiimide. Furthermore, the heat resistance of the urethane resin is improved by this crosslinking thereby giving resistance to high voltage to the electrostatic discharge protector, and the electrostatic discharge protector having reliability can be prepared.

In order to prepare the urethane resin having a carboxyl group, a polyol having a carboxyl group may be reacted together with the carbonate diol compound and the isocyanate compound.

As the polyol having a carboxyl group, it is preferred to use a dihydroxy aliphatic carboxylic acid having a carboxyl group particularly. Examples of the dihydroxyl compound are dimethylol propionic acid and dimethylolbutanoic acid. The carboxyl group can be easily placed in the urethane resin by the use of dihydroxyaliphatic carboxylic acid having a carboxyl group.

As the monohydroxyl compound, which is the end-sealing agent for the urethane resin, it is possible to use a compound having one hydroxyl group in its molecule, such as an aliphatic alcohol and a monohydroxy mono(meth)acrylate compound.

Examples of aliphatic alcohol are methanol, ethanol, propanol and isobutanol. An example of the monohydroxy mono (meth)acrylate compound is 2-hydroxyethyl acrylate.

To the structure of the urethane resin, a halogen such as chlorine or bromine, and an atom such as phosphorus etc. may be introduced in order to endow flame retardant properties.

The carbonate diol compound and the isocyanate compound are reacted in a blending ratio (the molar amount of carbonate diol compound:the molar amount of isocyanate compound) of preferably 50:100 to 150:100, more preferably 80:100 to 120:100.

As the solvent usable for the reaction of the carbonate diol compound with the isocyanate compound, nitrogen-free polar solvents are desired. Examples thereof are ether solvents such as diethylene glycol dimethylether, diethylene glycol diethylether, triethylene glycol dimethylether and triethylene glycol diethylether; sulfur solvents such as dimethyl sulfoxide, diethyl sulfoxide, dimethyl sulfone and sulfolane; ester solvents such as γ-butyrolactone, diethylene glycol monomethylether acetate, ethylene glycol monomethylether acetate, propylene glycol monomethylether acetate, diethylene glycol monoethylether acetate, ethylene glycol monoethylether acetate and propyleneglycol monoethylether acetate; ketone solvents such as cyclohexanone and methylethyl ketone; and aromatic hydrocarbon solvents such as toluene, xylene and petroleum naphtha. These may be used singly or two or more may be combined for use. Examples of the solvents having high volatility and capable of giving low-temperature curing properties are γ-butyrolactone, diethylene glycol monomethylether acetate, ethylene glycol monomethylether acetate, propyleneglycol monomethylether acetate, diethylene glycol monoethylether acetate, ethylene glycol monoethylether acetate and propyleneglycol monoethylether acetate.

In the case of reacting the polyol having a carboxyl group together with the carbonate diol compound and the isocyanate compound, the polyol having a carboxyl group is used in an amount such that the ratio of the total of the molar amount (A) of the carbonate diol compound and the molar amount (B) of the isocyanate compound to the molar amount (C) of polyol ((A)+(B):(C)) is 50:100 to 150:100, more preferably 80:100 to 120:100.

The reaction temperature is preferably 30 to 160° C., more preferably 50 to 140° C. When the temperature is lower than 30° C., the reaction time is prolonged, while when it is over 160° C., gelation is easily caused by three-dimensional reaction.

The reaction time varies by the reaction temperature. It is preferably 2 to 36 hr, more preferably 8 to 16 hr. When it is less than 2 hr, it is difficult to control even if the reaction temperature is increased in order to obtain the desired number average molecular weight. On the other hand, when it is over 36 hr, it is not practical.

The urethane resin has a number average molecular weight of preferably 500 to 100,000, more preferably 8,000 to 50,000. Herein, the number average molecular weight is a value relative to polystyrene determined by measurement by a gel permeation chromatography. When the urethane resin has a number average molecular weight of less than 500, the cured film occasionally loses extensibility, flexibility and strength, while when it has a number average molecular weight of over 1,000,000, it is hard and will be lowered on flexibility.

Even if the urethane resin has no acid value, the electrostatic discharge protector capable of attaining the object of the present invention can be formed. However, taking into account the fact that the lifetime of home electrical appliance is several years, the resin, which is filled in the discharge gap, desirably has a long lifetime. On this account, the urethane resin desirably has an acid value. When the urethane resin has an acid value, the resin can be made to have a long lifetime by forming a crosslinked structure utilizing its oxidation. The urethane resin has an acid value of preferably 5 to 150 mgKOH/g, more preferably 30 to 120 mgKOH/g. When the acid value is less than 5 mgKOH/g, the reactivity with the curing components lowers and thereby the desired heat resistance and long-time reliability are not obtained occasionally. When the acid value is over 150 mgKOH/g, the flexibility is easily lost and thereby the long-time insulating properties and the like are occasionally decreased. The acid value of the resin is a value measured in accordance with JIS K5407.

Other preferable examples of the resin having the urethane structure represented by the formula (1) may include resins obtainable by reacting a polycarboxylic acid having an acid anhydride group or its derivative with an isocyanate compound.

Examples of the polycarboxylic acid having an acid anhydride group or its derivative are a trivalent polycarboxylic acid having an acid anhydride group and its derivative and a quadrivalent polycarboxylic acid having an acid anhydride group.

Non-limitative examples of the trivalent polycarboxylic acid having an acid anhydride group and its derivative are compounds represented by the following formulas (2) and (3).

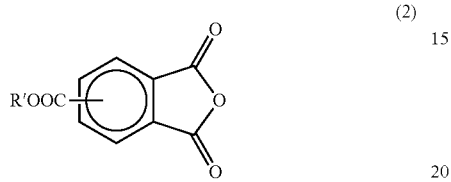
(2)

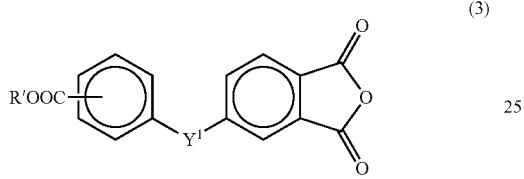
(3)

In the formulas, R' is hydrogen, an alkyl group of 1 to 10 carbon atoms or a phenyl group, $Y^1$ is —$CH_2$—, —CO—, —$SO_2$— or —O—. As the trivalent polycarboxylic acid having an acid anhydride group and its derivative, trimellitic acid anhydride is particularly preferred from the viewpoint of heat resistance and cost.

Non-limitative examples of the quadrivalent polycarboxylic acid having an acid anhydride group may include a tetracarboxylic acid di-anhydride represented by the formula (4).

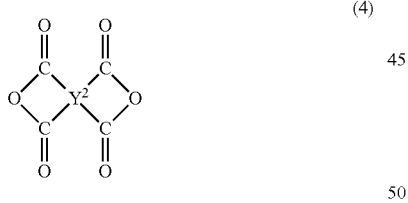
(4)

In the formula, $Y^2$ is a group represented by the following formulas.

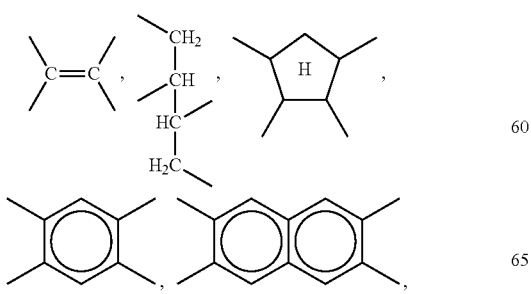

-continued

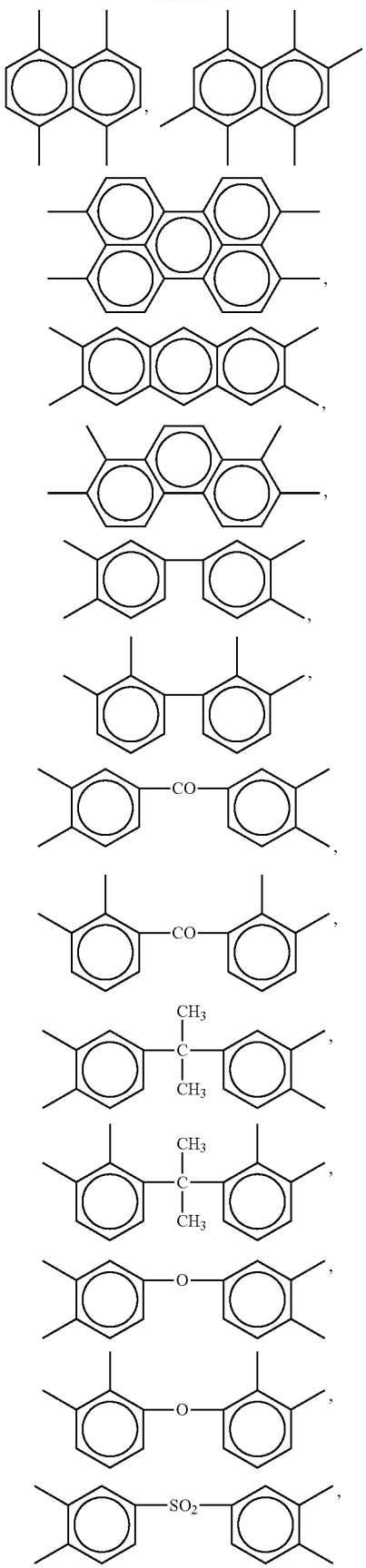

-continued

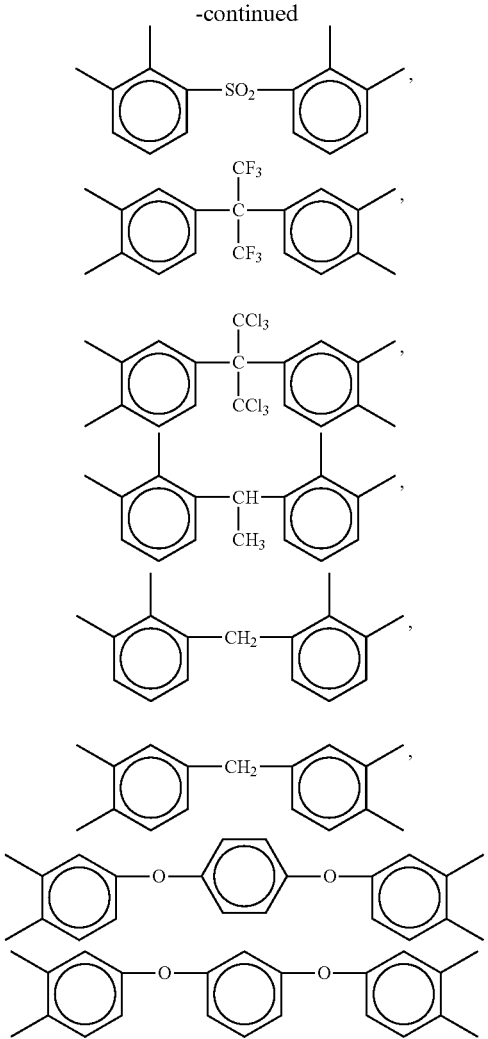

These may be used singly or two or more may be combined for use.

Together with the polycarboxylic acid having an acid anhydride group or its derivative, it is possible to use, as an acid component, an aliphatic dicarboxylic acid such as succinic acid, glutaric acid, adipic acid, azelaic acid, suberic acid, sebacic acid, decane di-acid, dodecane di-acid and dimer acid; and an aromatic dicarboxylic acid such as isophthalic acid, terephthalic acid, phthalic acid, naphthalene dicarboxylic acid and oxy dibenzoic acid in accordance with necessity. When the acid components are co-used, an amide bond is also formed in the molecule chain.

As the isocyanate compound, a diisocyanate compound represented by the following formula (5) is given.

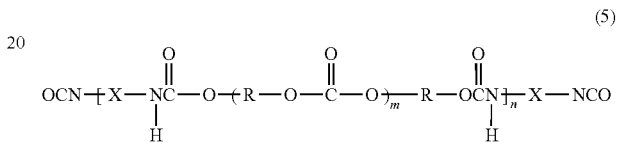

(5)

In the formula, plural R's are each independently an alkylene group of 1 to 18 carbon atoms, and m and n are each independently an integer of 1 to 20.

The diisocyanate compound represented by the formula (5) is obtainable by reacting the carbonate diol compound with the isocyanate compound.

The diisocyanate compound may be stabilized by a necessary blocking agent in order to avoid the change with elapse of time and submitted to use. Non-limitative examples of the blocking agent are alcohol, phenol and oxime.

In the case of using the compound represented by the formula (2) and the compound represented by the formula (5), a polyamide imide resin having a repeating unit represented by the following formula (6) can be obtained.

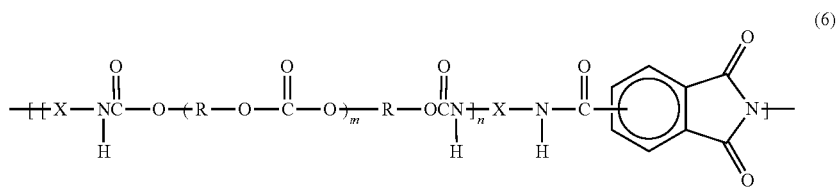

(6)

In the formula, R, X, m and n are defined above.

In the case of using the compound represented by the formula (3) and the compound represented by the formula (5), a polyamide imide resin having a repeating unit represented by the following formula (7) can be obtained.

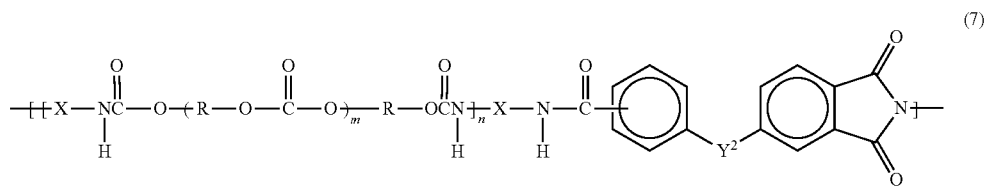

(7)

In the formula, R, X, m, n and $Y^1$ are defined above.

In the case of using the compound represented by the formula (4) and the compound represented by the formula (5), a polyamide imide resin having a repeating unit represented by the following formula (8) can be obtained.

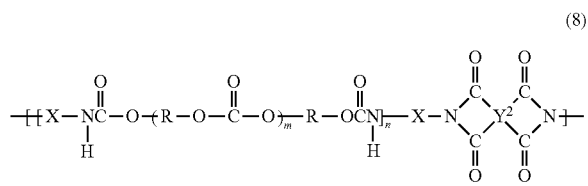

(8)

In the formula, R, X, m, n and $Y^2$ are defined above.

These resins having an imide bond can be produced by heating and condensing in the presence of the organic solvent, preferably the nitrogen-free polar solvent while removing a carbon dioxide gas liberated and generated from the reaction system.

Other Components

The resin composition for filling a discharge gap according to the present invention may contain, if necessary, a curing component, a curing accelerating agent, a filler, a solvent, a foaming agent, a defoaming agent, a leveling agent, a lubricant, a plasticizer, a rust proofing agent and a viscosity-regulating agent in addition to the resins having a urethane structure represented by the formula (1).

The curing component is a compound having a functional group, which compound can be cured by reacting with the carboxyl group of the above resin. When the urethane resin has an acid value, the curing component is used for forming crosslinked products. Examples of the curing component are an epoxy resin and a carbodiimide resin.

Examples of the epoxy resin are epoxy compounds having two or more epoxy groups in one molecule, such as bisphenol A type epoxy resin, hydrogenated bisphenol A type epoxy resin, brominated bisphenol A type epoxy resin, bisphenol F type epoxy resin, novolac type epoxy resin, phenol-novolac type epoxy resin, cresol-novolac type epoxy resin, N-glycidyl type epoxy resin, bisphenol A-novolac type epoxy resin, chelate type epoxy resin, glyoxal type epoxy resin, amino group-containing epoxy resin, rubber modified epoxy resin, dicyclopentadiene phenolic type epoxy resin, silicone modified epoxy resin and ∈-caprolactam modified epoxy resin. Furthermore, epoxy resins in which a halogen such as chlorine or bromine or an atom such as phosphorus etc. is introduced in its structure may be also used in order to endow flame retardant properties. Moreover, it is possible to use bisphenol S type epoxy resin, diglycidylphthalate resin, heterocyclic epoxy resin, bixylenol type epoxy resin, biphenol type epoxy resin and tetraglycidyl xylenoylethane resin.

Examples of the carbodiimide resins are carbodilight oily type resin series commercially available from Nisshinbo Industries Inc. which chains are lengthened by urethanizing reaction of an isocyanate end group-having carbodiimide compound with polypropylene glycol. Since the carbodiimide is reacted with a carboxyl group at ordinary temperature, it is suitable for preparing electrostatic discharge protectors for a short period of time.

The curing components may be used singly or two or more may be mixed for use. The curing components are preferably used in an amount such that the ratio of epoxy equivalent weight or carbodiimide equivalent weight of the curing agents to carboxyl group equivalent weight, which are introduced into the urethane resin, is 0.5 to 3.0. When the ratio is less than 0.5, the desired heat resistance and long term reliability are not obtained occasionally, while when it is over 3.0, the shrinking amount of the curing film is increased and thereby the flexibility is likely deteriorated in using it to flexible print wiring boards.

A curing accelerating agent is used for curing the urethane resin in which a carboxyl group is introduced. Examples of the curing accelerating agent are imidazole derivatives such as 2MZ, 2E4MZ, $C_{11}Z$, $C_{17}Z$, 2PZ, 1B2MZ, 2MZ-CN, 2E4MZ-CN, $C_{11}$Z-CN, 2PZ-CN, 2PHZ-CN, 2MZ-CNS, 2E4MZ-CNS, 2PZ-CNS, 2MZ-AZINE, 2E4MZ-AZINE, $C_{11}$Z-AZINE, 2MA-OK, 2P4 MHZ, 2PHZ and 2P4BHZ (manufactured by Shikoku Chemicals Corporation); quanamines such as acetoguanamine and benzoguanamine; polyamines such as diaminodiphenylmethane, m-phenylene diamine, m-xylene diamine, diaminodiphenyl sulfone, dicyane diamide, urea, urea derivative, melamine and polybasic hydrazide; organic acid salts and/or epoxy adduct thereof; amine complexes of bromine trifluoride; triazine derivatives such as ethyldiamino-S-triazine, 2,4-diamino-S-triazine and 2,4-diamino-6-xylyl-S-triazine; amines such as trimethylamine, triethanolamine, N,N-dimethyloctylamine, N-benzyldimethylamine, pyridine, N-methylmorpholine, hexa(N-methyl)melamine, 2,4,6-tris(dimethylaminophenol), tetramethylquanidine and m-aminophenol; polyphenols such as polyvinylphenol, polyvinylphenol bromides, phenol novolac and alkylphenol novolac; organic phosphines such as tributylphosphine, triphenyl phosphine and tris-2-cyanoethyl phosphine; phosphonium salts such as tri-n-butyl (2,5-dihydroxyphenyl)phosphonium bromide and hexadecyl tributylphosphonium chloride; ternary ammonium salts such as benzyl trimethylammonium chloride and phenyl tributylammonium chloride; polybasic acid anhydrides; optical cation polymerization catalysts such as diphenyl iodonium tetrafluoroboroate, triphenyl sulfonium hexafluoroanntimonate, 2,4,6-triphenyl thiopyrilium hexafluorophosphoate, Irgacure 261 manufactured by Ciba Geigy and Optomer SP-170 manufactured by Asahi Denka Co., Ltd.; styrene-anhydrous maleic acid resins; known curing agents or curing accelerating agents such as equimolar reactants of phenylisocyanate and dimethyl amine, equimolar reactants of dimethylamine and organic polyisocyanates, i.e. tolylenediisocyanate or isophorone diisocyanate.

These curing accelerating agents may be used singly or two or more may be mixed for use. The use of the curing accelerating agent is not essential. Particularly, when the curing is desired to be accelerated, the curing accelerating agents can be used in an amount of not more than 25 parts by mass based on 100 parts by mass of the curing components. The amount is unfavorably over 25 parts by mass because the amount of sublimating components caused from its cured products is increased.

The filler is used for giving printability to the composition. In this case, examples of the filler are inorganic fillers such as barium sulfate, silicon resin powder, silica fine particles and talc; and organic fillers such as thermoplastic resins, heat resins and rubber polymers. Since aerial discharge occasionally occurs in the interface of the filler and the urethane resin, to cause deterioration, it is preferred that the filler is not mixed in the case of the discharge gap having a width of 2 to 10 μm. Since the resin composition for filling the discharge gap according to the present invention contains the above urethane resin, it can resist the use at a high voltage even if the filler is not added.

The resin composition for filling a discharge gap according to the present invention can contain conductive particles. The conductive particles preferably used in the present invention have an average particle diameter of 0.1 to 10 µm, preferably a largest particle diameter of less than 20 µm, more preferably a largest particle of less than 10 µm.

Examples of the conductive particles are nickel, copper, aluminum, silver, gold, zinc, iron, tungsten, metal alloys, carbon black, graphite, black lead, gas phase carbon fiber, polypyrol resin powder and polyaniline powder. Examples of the metal alloys are stainless steel etc. Among them, nickel, aluminum, tungsten, carbon black, black lead and gas phase carbon fiber are more preferable. Using the resin having the urethane structure represented by the formula (1) according to the present invention, the dispersion properties of the conductive particles are favorable.

The resin composition for filling a discharge gap contains the conductive particles in an amount of preferably not less than 30% by volume and less than 99% by volume, more preferably not less than 40% by volume and less than 65% by volume. When the amount is less than 30% by volume, the effect as the electrostatic discharge protector is occasionally lowered. On the other hand, the amount is unfavorably over 99% by volume, because the conductive particles do not sufficiently cover on the resin to cause the possibility of conducting.

In order to avoid separation of the conductive particles, which have highly been packed, an insulating member is formed by the resin composition for filling the discharge gap and then a surface protective film may be formed on the insulating member using the urethane resin, silicon resin or epoxy resin used in the present invention.

The solvent is used for regulating the viscosity of the composition. Examples of the solvent used for regulating the viscosity are solvents having a glycol skeleton, which have excellent solubility for resins, low odor and easy handling, such as ethylene glycol dimethylether, ethylene glycol diethylether, diethylene glycol ethylether acetate, carbitol acetate, propyleneglycol methylether acetate, dipropylene glycol methylether acetate, ethylcarbitol acetate and butylcarbitol acetate. Other examples of the solvent are γ-butyrolactone, toluene, xylene, ethylbenzene, nitrobenzene, isophorone, methyl methoxypropionate, ethyl ethoxypropionate, n-butyl acetate, N,N-dimethylformamide and n-methylpyrrolidone.

The resin composition for filling the discharge gap according to the present invention has a viscosity at 25° C. of preferably 2 to 200,000 mPa·s. The resin composition having the viscosity in this range can be applied by any method of potting, bar coating, screen-printing and spin coating. When the viscosity is over 200,000 mPa·s, it is difficult to conduct printing, while when it is less than 2 mPa·s, it is difficult to prepare a uniform film thickness.

<Electrostatic Discharge Protector>

The electrostatic discharge protector of the present invention is used as a protective circuit for releasing overcurrent to earth ground in order to protect a device at the time of electrostatic discharging. The electrostatic discharge protector of the present invention generally shows a high electric resistance value at the time of normal operating at a low voltage and feeds a current to the device without releasing the current to earth ground. Meanwhile, when transient phenomenon is caused at the time of electrostatic discharging, the electrostatic discharge protector shows a low electric resistance value instantly and releases overcurrent to earth ground and thereby prevents the device from feeding of overcurrent. When transient phenomenon is dissolved, the electrostatic discharge protector returns to have a high electric resistance value and feeds a current to the device. Since the electrostatic discharge protector of the present invention is provided with the discharge gap filled with the insulating resin, it does not have a danger of occurrence of a leak current at the time of normal operation at all. In fact, when a current of not more than DC10V is applied between the electrodes, the resistance value can be made to be not less than $10^{10}\Omega$ and thereby the protection from electrostatic discharge can be firmly realized.

The electrostatic discharge protector of the present invention is formed from at least two electrodes and one insulating member. The two electrodes are disposed at a definite distance. The gap between the two electrodes is a discharge gap. The discharge gap is filled with the insulating member. Namely, the insulating member is sandwiched with the two electrodes for forming the discharge gap, and the two electrodes are connected through the insulating member.

The insulating member is formed from the above described resin composition for filling the discharge gap. The electrostatic discharge protector of the present invention can be produced using the resin composition for filling the discharge gap by forming the insulting member in the following manner.

That is to say, the resin having a urethane structure represented by the formula (1) and other components optionally added, such as the solvent, the filler or the curing catalyst are dispersed and mixed by means of a Disper, kneader, 3-roll mill or bead mill. In the mixing, they may be heated at a sufficient temperature in order to enhance the compatibility. After the dispersion and mixing, the curing components are added optionally and mixed to form the resin composition for filling the discharge gap. The discharge gap is filled with the composition by potting, screen printing or other methods and cured with heating to form the insulating member sandwiched with two electrodes. As another method, the composition is cured with heating to form the insulating member capable of putting into the discharge gap, and the discharge gap is filled with the insulating member, or the composition is cured with heating to prepare a cured product and this cured product is processed so that the discharge gap can be filled with the cured product to form the insulating member and then the insulating member is put in the discharge gap.

The discharge gap of the electrostatic discharge protector has a width of 2 to 10 µm, preferably 2 to 7 µm. The width of the discharge gap means the shortest distance between the electrodes.

From the Paschen's Law, when the distance of the discharge gap is, for example, 7 µm, the operating voltage as the electrostatic discharge protector is 350 V. When a pulse voltage of over 350 V is loaded, it is assumed that the insulating properties of the electrostatic discharge protector are changed into conductive properties. In the electrostatic discharge protector of the present invention, the operating voltage is higher than 350 V because the discharge gap is filled with the resin. However, the operating voltage is preferably 500 V or from 300 V to 500 V in order to protect IC or LSI. In the case of using the resin composition for filling the discharge gap according to the present invention, when the discharge gap has a width of 2 to 10 µm, the operating voltage of 300 V to 500 V can be easily obtained.

When the resin composition for filling the discharge gap contains conductive particles, it is possible to use the discharge gaps having a width of 2 to 10 µm, further, when the width is over 10 µm, it is possible to perform electrostatic discharge protection. In consideration of the particle diameters of the conductive particles, the width of the discharge gap needs to be wider than the largest particle diameter of the conductive particles, and the width of the discharge gap is preferably 30 to 150 µm. When the width is less than 30 µm, or over 150 µm, it is likely the stability is lowered.

In the case that the discharge gap having a width of 30 to 150 μm between one pair of the electrodes is filled with the insulating member formed from the composition containing the conductive particles, when the resistance value at DC 10V in the insulating member is less than $10^{10}\Omega$, since the performance is insufficient as the insulating member, it is preferred to cover the conductive particle surfaces with the resin surely.

FIG. 1 shows a vertical section of an electrostatic discharge protector 11 which is one embodiment of the electrostatic discharge protector according to the present invention. The electrostatic discharge protector 11 is formed from an electrode 12A, an electrode 12B and an insulating member 13. The electrode 12A and the electrode 12B are disposed in such a way that their axes directions are identical and their top surfaces are faced each other. The discharge gap 14 is formed between end surfaces faced each other of the electrode 12A and the electrode 12B. The insulating member 13 is put in the discharge gap 14 in such a way that it covers the top portion of the electrode 12A which portion is faced to the top portion of the electrode 12B and the top portion of the electrode 12B which portion is faced to the top portion of the electrode 12A from upper side and is contact with the top portions. The width of the discharge gap 14, namely the distance between the top portions of the electrode 12A and the electrode 12B faced each other is preferably 2 to 10 μm. When the insulating member 13 contains the conductive particles, although the discharge gap having a width of 2 to 10 μm can be used, the discharge gap has a width of preferably 30 to 150 μm.

Figure 2:
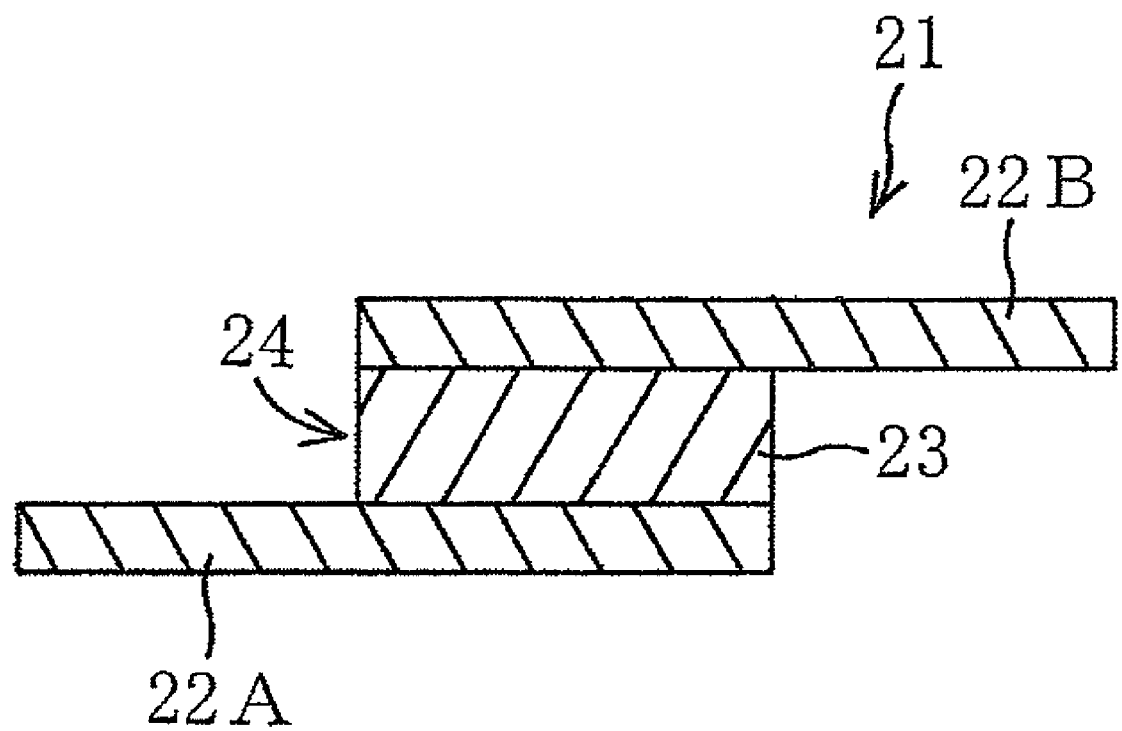
FIG. 2 is a vertical section of an electrostatic discharge protector 21, which is one embodiment of the electrostatic discharge protectors according to the present invention.

FIG. 2 shows a vertical section of an electrostatic discharge protector 21, which is one embodiment of the electrostatic discharge protector according to the present invention. The electrostatic discharge protector 21 is formed from an electrode 22A, an electrode 22B and an insulating member 23. The electrodes 22A and 22B are disposed in parallel in such a way that the top portions thereof are piled up in a vertical direction. On the part that the electrodes 22A and 22B are lied up in a vertical direction, the discharge gap 24 is formed. The insulating member 23 has a rectangular cross section and is put in the discharge gap 24. The width of the discharge gap 24, namely the distance between electrodes 22A and 22B in the part that the electrodes 22A and 22B are piled up in a vertical direction is preferably 2 to 10 μm. When the insulating member 23 contains the conductive particles, although the discharge gap having a width of 2 to 10 μm can be used, the discharge gap has a width of preferably 30 to 150 μm.

Concerning the desired properties of the electrostatic discharge protector according to the present invention, such that it shows a low electric resistance value instantly in transient phenomenon at the time of electrostatic discharging, an applied voltage, namely an operating voltage is important at the time of changing into a low electric resistance value. The operating voltage is evaluated in the following method using a semiconductor electrostatic tester ESS-6008 (manufactured by NOISE LABORATORY) can be used. At first, any voltage is applied and a peak current is measured and then the electrostatic discharge protector is installed in the semiconductor electrostatic tester. The same voltage is applied and a peak current is measured. The voltage at which 70% or more of the peak current in the case free from the electrostatic discharge protector is taken as an operating voltage. In fact, the protecting function against IC and LSI mounted is confirmed at the operating voltage resulted by this evaluation. As a result, the protecting properties can be confirmed.

Concerning the other desired repeating properties of the electric resistance value of the electrostatic discharge protector according to the present invention, such that when electrostatic discharge is cancelled, the electric resistance value returns to be a high value, it is determined in the following method. When application at 8 kV is repeated 50 times in HBM model in accordance with IEC61340-3-1, and the electric resistance value at DC10V is not changed, it is confirmed that the electrostatic discharge protector has the repeating properties for ESD protection. Therefore, the electrostatic discharge protector is installed in the semiconductor electrostatic tester ESS-6008 (manufactured by NOISE LABORATORY) and an 8 kV voltage is applied 50 times. The electric resistance value at DC10V is measured and it is confirmed that the original insulating properties are not changed.

The electrostatic discharge protector of the present invention is applied to electronic wiring boards or electronic apparatuses with the built-in electronic wiring board and also it is a useful technique capable of providing ESD protecting circuits freely, simply and easily and having responsibility for the industrial demands.

EXAMPLES

The present invention will be described in more detail with reference to the following examples below, but it should not be limited by these examples.

[Preparation of Electrostatic Discharge Protector]

On a polyimide film having a film thickness of 25 μm, one pair of electrode patterns (film thickness: 12 μm) were formed in a prescribed distance between the electrodes in such a way that the end surfaces of the electrode patterns are disposed to be faced each other in an arbitrary distance to prepare a wiring board. The wiring board is disposed on a hot plate heated at 120° C. The resin composition prepared by the method described later was potted on the gap of one pair of electrodes followed by curing, to prepare an ESD protective circuit having the structure represented by FIG. 1, namely an electrostatic discharge protector. The curing was carried out in the conditions of using a hot plate heated at 120° C. for 5 min and a constant temperature vessel at 150° C. for 30 min.

[Method of Evaluating Resistance at the Time of Normal Operating]

Regarding the electrodes on the both ends of the electrostatic discharge protector, the resistance at the time of DC10V application was measured using an insulation resistance meter "MEGOHMMETER SM-8220" and the resistance at the time of normal operating was evaluated from the electric resistance value in accordance with the following standard.

A: The electric resistance value is not less than $10^{10}\Omega$.
B: The electric resistance value is less than $10^{10}\Omega$.

[Method of Evaluating the Operating Voltage]

Using the semiconductor electrostatic tester ESS-6008 (manufactured by NOISE LABORATORY), a peak current at an arbitrary applied voltage was measured. Thereafter, the resulted electrostatic discharge protector was installed in the semiconductor electrostatic tester, and the same voltage was applied and the peak current was measured. When 70% or more of the peak current at the time without the electrostatic discharge protector was observed, the applied voltage was measured. The applied voltage was evaluated as an operating voltage in accordance with the following standard.

A: The operating voltage is not less than 350V and less than 500V.
B: The operating voltage is not less than 500V and less than 1000V.
C: The operating voltage is not less than 1000V and less than 2000V.
X: The operating voltage is not less than 2000V. In this case, the application is impossible or difficult.

[Method of Evaluating the High Voltage Resistant Properties at the Time of Applying Electrostatic Discharge Repeatedly]

The electrostatic discharge protector was installed in the semiconductor electrostatic tester ESS-6008 (manufactured by NOISE LABORATORY) and an 8 kV voltage was applied 10 times. The resistance value at the time of DC10V application was measured using an insulation resistance meter "MEGOHMMETER SM-8220". From the resistance value, the high voltage resistant properties were evaluated in accordance with the following standard.

A: The resistance value is not less than $10^{10}\Omega$.
B: The resistance value is not less than $10^8\Omega$ and less than $10^{10}\Omega$.
X: The resistance value is less than $10^8\Omega$. In this case, the application is impossible or difficult.

Synthetic Example 1

To a reactor equipped with a stirrer, a thermometer and a condenser, 707 g of "C-1065N" (raw material diol molar ratio:the mole number of 1,9-nonane diol:the mole number of 2-methyl-1,8-octane diol=65:35, molecular weight 991 manufactured by Kuraray Co., Ltd.) as a polycarbonate diol compound, 135 g of 2,2-dimethylol butanoic acid (manufactured by Nippon Kasei Chemical Co., Ltd) as a dihydroxyl compound having a carboxyl group and 1289 g of diethylene glycol ethyl ether acetate (manufactured by Daicel Chemical Industries Ltd) as a solvent were fed and all the raw materials were dissolved at 90° C. The temperature of the reaction solution was decreased to 70° C. and 424 g of "Desmodur-W" (methylenebis(4-cyclohexylisocyanate) manufactured by Sumika Bayer Urethane Ltd.) as an isocyanate compound was dropped by a dropping funnel over 30 min. After the completion of dropping, the reaction was carried out at 80° C. for 1 hr, at 90° C. for 1 hr and at 100° C. for 2 hr until isocyanate was consumed. The consumption of isocyanate was confirmed by the way that the infrared absorption spectra of the reaction solution were measured and a peak at around 2300 $cm^{-1}$ assigned to isocyanate was disappeared. Thereafter, 146 g of isobutanol (manufactured by Wako Pure Chemical Industries Ltd.) was dropped and further reacted at 105° C. for 1.5 hr to prepare 2430 g of a carboxyl group-containing polyurethane solution (U-1).

The resulting carboxyl group-containing polyurethane solution (U-1) had a solid component concentration of 50% by mass the number average molecular weight of carboxyl group-containing polyurethane was 10,000, and the acid value of the solid component was 39.9 mg KOH/g.

Synthetic Example 2

To a reactor equipped with a stirrer, a thermometer and a condenser, 1025 g of "C-2015N" (raw material diol molar ratio:the mole number of 1,9-nonane diol:the mole number of 2-methyl-1,8-octane diol=90:10, molecular weight 1945 manufactured by Kuraray Co., Ltd.) as a polycarbonate diol compound, 51 g of 2,2-dimethylol butanoic acid (manufactured by Nippon Kasei Chemical Co., Ltd) as a dihydroxyl compound having a carboxyl group and 1289 g of diethylene glycol ethyl ether acetate (manufactured by Daicel Chemical Industries Ltd) as a solvent were fed and all the raw materials were dissolved at 90° C. The temperature of the reaction solution was decreased to 70° C. and 190 g of "Desmodur-W" (methylenebis(4-cyclohexylisocyanate) manufactured by Sumika Bayer Urethane Ltd.) as an isocyanate compound was dropped by a dropping funnel over 30 min. After the completion of dropping, the reaction was carried out at 80° C. for 1 hr, at 90° C. for 1 hr and at 100° C. for 2 hr until isocyanate was consumed. The consumption of isocyanate was confirmed by the way that the infrared absorption spectra of the reaction solution were measured and a peak at around 2300 $cm^{-1}$ assigned to isocyanate was disappeared. Thereafter, 146 g of isobutanol (manufactured by Wako Pure Chemical Industries Ltd.) was dropped and further reacted at 105° C. for 1.5 hr to prepare 2430 g of a carboxyl group-containing polyurethane solution (U-2).

The resulting carboxyl group-containing polyurethane solution (U-2) had a solid component concentration of 50% by mass and the number average molecular weight of carboxyl group-containing polyurethane was 10,000, and the acid value of the solid component was 10.0 mg KOH/g.

Synthetic Example 3

Synthesis was carried out in the same conditions as in those of Synthetic example 1 except that the reaction of the isocyanate compound after dropping was carried out at 120° C. for 9 hr. A carboxyl group-containing polyurethane solution (U-3) was prepared in an amount of 2430 g.

The resulting carboxyl group-containing polyurethane solution (U-3) had a solid component concentration of 50% by mass and the number average molecular weight of carboxyl group-containing polyurethane was 13,000, and the acid value of the solid component was 39.9 mg KOH/g.

Synthetic Example 4

To a reactor equipped with a stirrer, a thermometer and a condenser, 1000 g of "PLACCEL CD-220" (1,6-hexanediol polycarbonate diol manufactured by Daicel Chemical Industries Ltd.,) as a polycarbonate diol compound, 250 g of 4,4-diphenylmethane diisocyanate and 834 g of γ-butyrolactone were fed and reacted at 160° C. for 5 hr. Furthermore, 358 g of 3,3',4,4'-diphenylsulfone tetracarboxylic acid dianhydride, 125 g of 4,4'-diphenylmethane diisocyanate and 585 g of γ-butyrolactone were fed and heated at 160° C. and further reacted for about 5 hr until the number average molecular weight as measured by GPC was 15,000, to prepare 3150 g of a polyurethane solution (U-4).

The resulting polyurethane solution (U-4) had a solid component concentration of 55% by mass and the number average molecular weight of polyurethane was 10,000, and the acid value of the solid component was 0 mg KOH/g.

Example 1

Using a homogenizer (60 rpm), 100 g of the carboxyl group-containing polyurethane solution (U-1) prepared in Synthetic example 1, 6.6 g of "Epicote 828EL" (Trade Name: bisphenol A type bifunctional epoxy resin manufactured by Japan Epoxy Resin Co., Ltd.), 0.5 g of "1B2MZ" (manufactured by Shikoku Chemicals corporation) as a thermal curing catalyst, 1.0 g of AEROSIL#380 (Trade Name: silica fine particles manufactured by Nippon Aerosil Co.) as a thixotropic agent and 22.8 g of diethylene glycol ethylether acetate were stirred for 15 min to prepare a resin composition for filling a discharge gap. In a wiring board having an electrode discharge gap of 10 μm, 3 μL of the resin composition for filling a discharge gap was potted and cured with heating to prepare an electrostatic discharge protector.

The electrostatic discharge protector was evaluated on resistance at the time of normal operating, operating voltage and high voltage resistant properties by the above methods.

The results are shown in FIG. 1.

Example 2

Using a homogenizer (60 rpm), 100 g of the carboxyl group-containing polyurethane solution (U-2) prepared in Synthetic example 2, 1.5 g of "Epicote 828EL" (Trade Name:

bisphenol A type bifunctional epoxy resin manufactured by Japan Epoxy Resin Co., Ltd.), 0.5 g of "1B2MZ" (manufactured by Shikoku Chemicals corporation) as a thermal curing catalyst, and 22.8 g of diethylene glycol ethylether acetate were stirred for 15 min to prepare a resin composition for filling a discharge gap. In a wiring board having an electrode discharge gap of 2 μm, 3 μL of the resin composition for filling a discharge gap was potted and cured with heating to prepare an electrostatic discharge protector.

The electrostatic discharge protector was evaluated on resistance at the time of normal operating, operating voltage and high voltage resistant properties by the above methods.

The results are shown in FIG. 1.

Example 3

Using a homogenizer (60 rpm), 100 g of the carboxyl group-containing polyurethane solution (U-3) prepared in Synthetic example 3, 6.6 g of "Epicote 828EL" (Trade Name: bisphenol A type bifunctional epoxy resin manufactured by Japan Epoxy Resin Co., Ltd.), 0.5 g of "1B2MZ" (manufactured by Shikoku Chemicals corporation) as a thermal curing catalyst and 22.8 g of diethylene glycol ethylether acetate were stirred for 15 min to prepare a resin composition for filling a discharge gap. In a wiring board having an electrode discharge gap of 5 μm, 3 μL of the resin composition for filling a discharge gap was potted and cured with heating to prepare an electrostatic discharge protector.

The electrostatic discharge protector was evaluated on resistance at the time of normal operating, operating voltage and high voltage resistant properties by the above methods.

The results are shown in FIG. 1.

Example 4

Using a planetary mixer, 100 g of the polyurethane solution (U-4) prepared in Synthetic example 4, 1.2 g of AEROSIL#380 (Trade Name: silica fine particles having an average particle diameter of not more than 0.2 μm, manufactured by Nippon Aerosil Co.) were stirred at 60 rpm for 30 min. Thereafter, to the mixture, 1 g of YH-434 (amine type epoxy resin, manufactured by Toto Kasei Co.,) and 28.0 g of γ-butylolactone were added and stirred for 15 min to prepare a resin composition for filling a discharge gap. In a wiring board having an electrode discharge gap of 7 μm, 3 μL of the resin composition for filling a discharge gap was potted and cured with heating to prepare an electrostatic discharge protector.

The electrostatic discharge protector was evaluated on resistance at the time of normal operating, operating voltage and high voltage resistant properties by the above methods.

The results are shown in FIG. 1.

Example 5

In a mortar, 100 g of the carboxyl group-containing polyurethane solution (U-3) prepared in Synthetic example 3, 0.05 g of "1B2MZ", 5 g of diethylene glycol ethylether acetate, 110 g of "08-0075" (aluminum powder manufactured by Toyo Alumi Co., Ltd.) and 18 g of "4SP-10" (nickel powder manufactured by Nikko Rica Co., Ltd) were ground and stirred at a hot plate at about 100° C. for 20 min with heating. Thereafter, the temperature was decreased to room temperature and then 0.07 g of "EPICOTE 828EL" was added to the mixture and stirred to prepare a resin composition for filling a discharge gap. This composition had a conductive particle content of 46% by volume. In a wiring board having an electrode discharge gap of 100 μm, 10 μL of the resin composition was potted and cured with heating to prepare an electrostatic discharge protector.

The electrostatic discharge protector was evaluated on resistance at the time of normal operating, operating voltage and high voltage resistant properties by the above methods.

The results are shown in FIG. 1.

Example 6

A resin composition for filling a discharge gap was prepared in the same manner as that of Example 5.

In a wiring board having an electrode discharge gap of 120 μm, 10 μL of the resin composition for filling a discharge gap was potted and cured with heating to prepare an electrostatic discharge protector.

The electrostatic discharge protector was evaluated on resistance at the time of normal operating, operating voltage and high voltage resistant properties by the above methods.

The results are shown in FIG. 1.

Comparative Example 1

A resin composition for filling a discharge gap was prepared in the same manner as that of Example 3.

In a wiring board having an electrode discharge gap of 1 μm, 3 μL of the resin composition for filling a discharge gap was potted and cured with heating to prepare an electrostatic discharge protector.

The electrostatic discharge protector was evaluated on resistance at the time of normal operating, operating voltage and high voltage resistant properties by the above methods.

The results are shown in FIG. 1.

Comparative Example 2

Using a homogenizer (60 rpm), 20 g of soluble and highly transparent polyimide "PI-100" (a compound having the following formula manufactured by Maruzen Petroleum Co.) and 80.0 g of diethylene glycol ethylether acetate were stirred for 15 min to prepare a resin composition for filling a discharge gap. In a wiring board having an electrode discharge gap of 5 μm, 3 μL of the resin composition for filling a discharge gap was potted and cured with heating to prepare an electrostatic discharge protector.

Chemical formula 11

The electrostatic discharge protector was evaluated on resistance at the time of normal operating, operating voltage and high voltage resistant properties by the above methods.

The results are shown in FIG. 1.

Comparative Example 3

A resin composition for filling a discharge gap was prepared in the same manner as that of Example 3.

In a wiring board having an electrode discharge gap of 20 µm, 3 µL of the resin composition for filling a discharge gap was potted and cured with heating to prepare an electrostatic discharge protector.

The electrostatic discharge protector was evaluated on resistance at the time of normal operating, operating voltage and high voltage resistant properties by the above methods.

The results are shown in FIG. 1.

TABLE 1

| | Width of discharge gap (µm) | Resistance at the time of normal operating | Operating voltage | High voltage resistant properties |
|---|---|---|---|---|
| Example 1 | 10 | A | C | A |
| Example 2 | 2 | A | A | B |
| Example 3 | 5 | A | A | A |
| Example 4 | 7 | A | B | A |
| Example 5 | 100 | A | B | A |
| Example 6 | 120 | A | B | A |
| Comparative Example 1 | 1 | B | A | X |
| Comparative Example 2 | 5 | A | B | X |
| Comparative Example 3 | 20 | A | X | A |

DESCRIPTION OF MARK

11 . . . Electrostatic discharge protector
12A . . . Electrode
12B . . . Electrode
13 . . . Insulating member
14 . . . Discharge gap
21 . . . Electrostatic discharge protector
21A . . . Electrode
22B . . . Electrode
23 . . . Insulating member
24 . . . Discharge gap

The invention claimed is:

1. A resin composition for filling a discharge gap of an electrostatic discharge protector which composition comprises a resin having a urethane structure represented by the following formula (1):

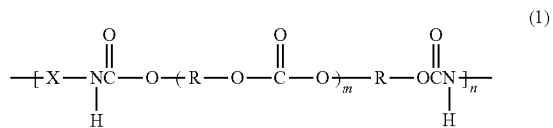

wherein plural R's are each independently an alkylene group of 1 to 18 carbon atoms or a cycloalkylene group of 6 to 18 carbon atoms, X is a bivalent organic group and m and n are each independently an integer of 1 to 20.

2. The resin composition for filling a discharge gap of an electrostatic discharge protector according to claim 1 wherein the resin having the urethane structure is obtainable by allowing a carbonate diol compound to react with a diisocyanate compound.

3. The resin composition for filling a discharge gap of an electrostatic discharge protector according to claim 1 wherein the resin having the urethane structure has a carboxyl group.

4. The resin composition for filling a discharge gap of an electrostatic discharge protector according to claim 3 wherein the resin composition further comprises a curing component having a functional group capable of curing by reacting with the carboxyl group of the resin.

5. The resin composition for filling a discharge gap of an electrostatic discharge protector according to claim 1 which composition further comprises at least one conductive particle selected from the group consisting of nickel, copper, aluminum, silver, gold, zinc, iron, tungsten, metal alloy, carbon black, graphite, black lead, carbon fibers prepared by a gas phase method, polypyrol resin powder and polyaniline powder.

6. An electrostatic discharge protector obtainable by filling a discharge gap with an insulating member formed from the resin composition for filling a discharge gap as claimed in claim 1 wherein the discharge gap has a width of 2 to 10 µm.

7. An electrostatic discharge protector obtainable by filling a discharge gap with an insulating member formed from the resin composition for filling a discharge gap as claimed in claim 5 wherein the discharge gap has a width of 30 to 150 µm.

8. An electronic circuit board provided with the electrostatic discharge protector as claimed in claim 6.

9. An electronic apparatus provided with the electronic circuit board as claimed in claim 8.

10. An electronic circuit board provided with the electrostatic discharge protector as claimed in claim 7.

11. An electronic apparatus provided with the electronic circuit board as claimed in claim 10.

* * * * *